United States Patent [19]

Kranik et al.

[11] 4,425,829

[45] Jan. 17, 1984

[54] PUNCH APPARATUS

[75] Inventors: John R. Kranik; George E. Melvin, both of Poughkeepsie; Wolfgang F. Mueller, Wappingers Falls, all of N.Y.

[73] Assignee: International Business Machines Corporation, Armonk, N.Y.

[21] Appl. No.: 303,248

[22] Filed: Sep. 17, 1981

[51] Int. Cl.[3] .......................... B23B 49/00; B26D 7/18
[52] U.S. Cl. .......................... 83/62.1; 83/98; 83/99; 83/100; 83/522; 234/33
[58] Field of Search ........................ 83/98, 99, 100, 62, 83/62.1, 522; 234/33, 34

[56] References Cited

U.S. PATENT DOCUMENTS

| | | | |
|---|---|---|---|
| 2,494,018 | 1/1950 | Urquhart | 83/98 X |
| 2,576,295 | 11/1951 | Good | 83/98 |
| 2,647,580 | 8/1953 | Connelly | 234/34 X |
| 2,707,028 | 4/1955 | Burton | 83/100 |
| 3,035,470 | 5/1962 | Tolerico | 83/98 X |
| 3,124,027 | 3/1964 | Loeffel | 83/98 |
| 3,524,368 | 8/1970 | Goldman | 83/98 |
| 3,620,113 | 11/1971 | Gargrave | 83/98 |
| 3,710,666 | 1/1973 | Keyes et al. | 83/99 |
| 3,728,919 | 4/1973 | Scott | 83/62 |
| 3,747,142 | 7/1973 | Arbogast et al. | 83/62 X |

FOREIGN PATENT DOCUMENTS 189662  6/1937  Switzerland ........................ 83/100

OTHER PUBLICATIONS

Beam et al., Western Electric Technical Digest No. 58, Apr. 1980, pp. 5-6, "Vacuum Slug-Removal Apparatus."
IBM TDB vol. 13, No. 9, Feb. 1971, p. 2536.
IBM TDB vol. 16, No. 12, May 1974, p. 3921.
IBM TDB vol. 16, No. 12, May 1974, p. 3933.

*Primary Examiner*—Francis S. Husar
*Assistant Examiner*—Steven B. Katz
*Attorney, Agent, or Firm*—Wolmar J. Stoffel

[57] ABSTRACT

An improved interposer punch apparatus including a plurality of elongated punch elements, a head slidably supporting the punch elements, means to urge the punch elements in an extended position, a stripper plate, and a base for supporting a substrate to be punched with apertures for receiving the lower ends of the punch elements, the imrovement being a means in said base for forcibly displacing slugs of material punched from a substrate from the ends of the punch elements following a punching operation.

5 Claims, 2 Drawing Figures

PUNCH APPARATUS

DESCRIPTION

TECHNICAL FIELD

This invention relates to improvements in apparatus for punching holes in sheet material, more particularly to improvements for punching apparatus for forming via holes in ceramic green sheets.

In the semiconductor packaging technology, multi-layer ceramic substrates formed of ceramic green sheets with via holes and conductive metal patterns are assembled and fired to provide monolithic ceramic substrates with internal metallurgy systems. The via holes in the green sheet are conventionally punched with mechanical punch apparatus having many very small punches that are very fragile and subject to severe abraision from the ceramic particles in the green ceramic sheet. Various malfunction such as punch breakage, blockage of punched holes by punched material, etc. can and do occur that result in blocked or absence of holes in the sheet. These conditions prevent conductive material from completing the metallurgy system, forming an "open" circuit. A single such defect in a multilayer ceramic substrate can render a completed sintered substrate unusable, representing a very significant loss since the finished substrate is a relatively expensive unit.

BACKGROUND ART

In the manufacture of multilayer ceramic (MLC) substrates for integrated circuit semiconductor package structures, a plurality of green ceramic sheets are formed by doctor blading a slurry containing a resin binder, a particulate ceramic material, solvents, and a plasticizer, drying the doctor bladed sheet and cutting it into appropriate size sheets. Via holes are then punched for forming electrical interconnections through the sheet, electrically conductive paste is deposited in the holes and in appropriate patterns on the surface of the sheets, the sheets stacked and subsequently fired at a sintering temperature. Punching of via holes in ceramic sheets presents formidable engineering problems in view of their small size and density. It is conventional to punch via holes with apparatus of the type disclosed in IBM TDB Vol. 13 No. 4 Feb. 1971 P. 2536 or IBM TDB Vol. 16 No. 12 May 1974 P. 3933. In these apparatus a plurality of punch elements arranged in the grid are indexed over the green sheet which is covered by an interposer mask. The interposer mask contains openings where holes are desired to be punched. When the punch elements contact the interposer mask as the punch head is moved downwardly, a hole will be punched where the openings occur since the punch element will pass through the openings in the interposer mask, and through the ceramic green sheet. In other areas covered by the interposer mask, i.e., where holes are not desired, the interposer mask will cause the punch element to be retracted into the head.

Automated punch apparatus which utilize individually programmable punches have been suggested in IBM TDB Vol. 20 No. 4 Sept. 1977 P. 1379. This type of punching apparatus does not require the aforedescribed interposer mask, since the individual punching elements can be activated electrically upon command.

DISCLOSURE OF INVENTION

In accordance with the present invention we provide improvements in punch apparatus for punching holes in sheet material in which material removed from the sheet is forceably displaced to thereby prevent its being inadvertently drawn back into the punched holes, and also detection structure that will indicate malfunctions of critical elements of the punch apparatus. More specifically a means is provided to generate a current of air beneath the die bushing that blows a punched slug of material from the end of a punch element after it has pierced the sheet. Sensors are provided to detect punch movement, and also air pressure within a pressurized chamber that is part of an air spring for biasing the punch elements in a downward position.

BRIEF DESCRIPTION OF DRAWINGS

In the accompanying drawings forming a material part of this disclosure

BEST MODE FOR CARRYING OUT THE INVENTION

Figure 2:
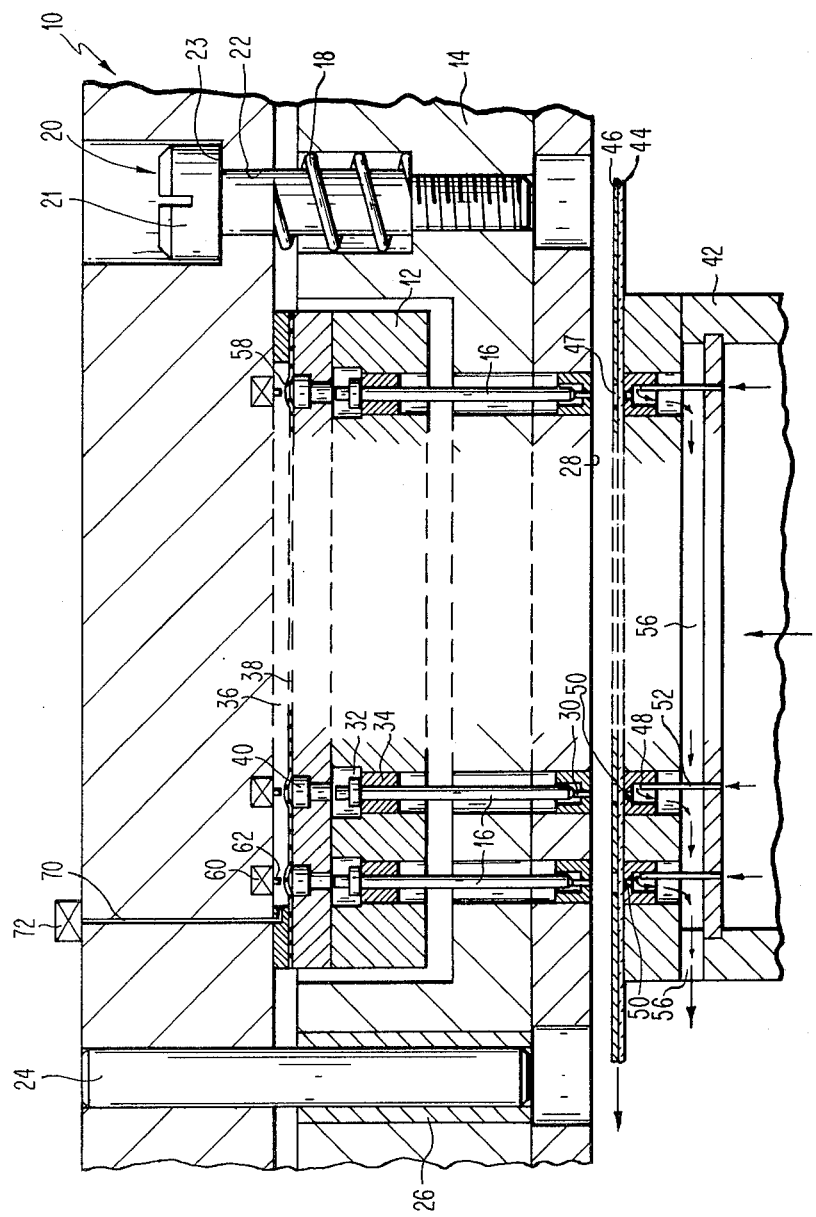
FIG. 2 is an elevational view in section of a punch apparatus head illustrating the location and arrangement of the elements thereof.

In accordance with the present invention, we provide an improved punched element for forming holes in sheet material, in particular ceramic green sheet. The punch apparatus as depicted in FIG. 2 of the drawings, has a punch head 10 supporting a punch plate 12. A stripper plate 14 encloses the lower ends of punch elements 16. Stripper plate 14 is biased downwardly by actuating springs 18 surrounding bolts 20 that are slidably supported in aperture 22 in punch head 10. The length of bolts 20 are adjusted so that the head 21 abuts against surface 23 to position the stripper plate so that the bottom surface 28 is substantially flush with the ends of punch elements 16. When the stripper plate 14 is forced upwardly compressing the springs 18 the tips 30 of punch elements 16 will protrude beyond surface 28. Guide pins 24 mounted in punch head 10 are slidably received in bushings 26 mounted on stripper plate 14. The punch elements 16 are resiliently urged downwardly so that the collar 32 is in abutting engagement with bushing 34 by the combination of a pressure chamber 36 a diaphram 38 and link element 40. The air under pressure in chamber 36 exerts a downward pressure on link 40 through diaphragm 38 to force punch element 16 in a downwardly extending relation. A substrate support 42 is provided to support green sheet 44 and interposer mask 46. Die bushings 48 are provided with an aperture 50 that is in alignment with the tip portion 30 of punch element 16. Green sheet 44 and mask 46 are indexed in both the X and Y directions by an indexing mechanism, not shown.

In operation, green ceramic sheet 44 is placed over substrate support 42 and an interposer mask 46, provided with holes 47 corresponding to the apertures desired in the green sheet is placed over sheet 44. The interposer mask and green sheet are secured at their periphery to the indexing mechanism to provide indexing movement, relating to the punches. The punch head 10 is moved downwardly by a suitable mechanism, not shown, to first force the stripper plate 14 against the interposer mask 46 and to continue urging the head downwardly as the springs 18 are compressed. As the punch head 10 is moved downwardly the tips of punch elements 30 will either contact the interposer mask 46 when there is no hole beneath the punch or be forced through the green sheet when an opening 47 is aligned with the punch element. The punch head is then retracted and the punch elements removed from the green sheet. The stripper plate 14 holds the interposer mask and green sheet against the substrate support as the punches are withdrawn. The green sheet 44 and interposer mask 46 are then indexed by the aforementioned indexing mechanism in the X and/or the Y direction and the cycle repeated. In practice the green sheet and mask are indexed in a desired number of steps over the center-to-center spacing of the punch elements in both the X and the Y directions. In this manner the entire green sheet 44 is exposed to the action of the punches. When an opening in the interposer mask is aligned with the punch, the punch punches a hole.

Figure 1:
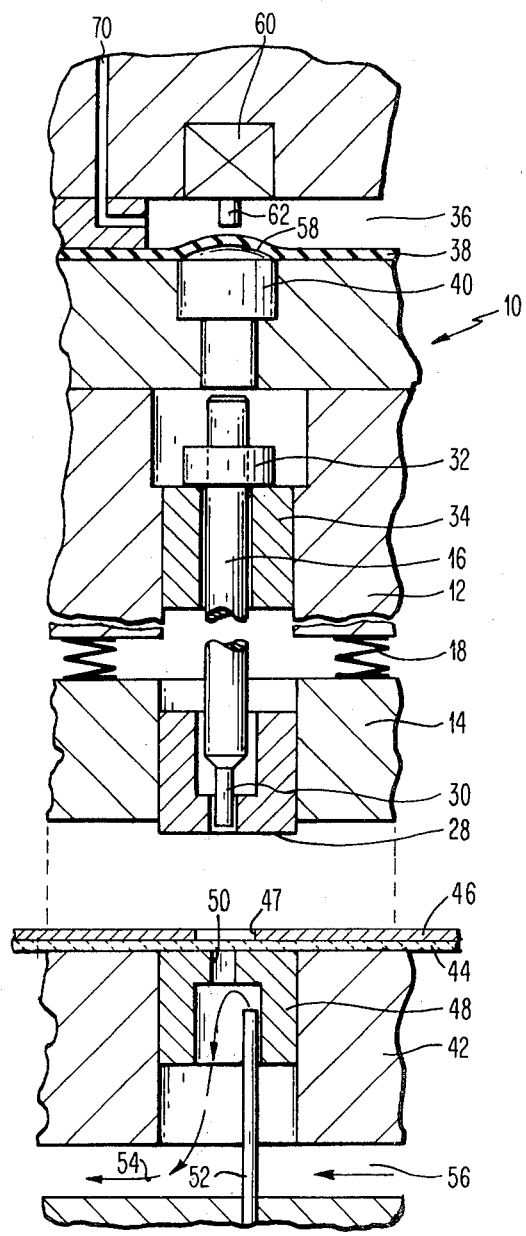
FIG. 1 is an elevational view in broken cross section of the punch element of the punching apparatus in which is illustrated various improvements of this invention.

Referring now to FIG. 1 there is illustrated in greater detail an improvement of our invention to the aforedescribed punch apparatus i.e., a means to forcibly displace slugs of material punched from the substrate from the ends of the punched elements following a punching operation. During the aforedescribed punching cycle the tip 30 of punch element 16 is forced through green sheet 44 pushing the removed slug of material downwardly through aperture 50 of die bushing 48. When the punch head is withdrawn, the material in a conventional punching apparatus may adhere to the end of the punching element and be drawn back upwardly through aperture 50 and into the previously punched aperture. In our invention there is provided a tube 52 with the end portion adjacent to aperture 50 and a means to cause a current of air, indicated by arrows 54. The current of air or any other suitable type gas or fluid can be produced by either connecting a source of pressure to the tube 52 or evacuating the chamber 56 leaving the opposite end of tube 52 open to the atmosphere. The desired objective is to blow the slug off the punch tip before it can be drawn back into the green sheet 44. Adherence of the punched slug to the punch element is more likely when the punch tip has been worn. This improvement can be used in solenoid operated punch apparatus as well as the apparatus illustrated.

Another improvement of our invention to the punching apparatus is the means for urging the punch elements downwardly in extending relation. Conventional punch elements are urged downwardly by a metallic spring element. In this apparatus the link element 40 has a curved top surface 58 that interacts with the cylindrical surface portion of link element 40 in the plane of the bottom surface of air chamber 36. When a punch element contacts an interposer mask, the punch element is forced upwardly moving link element 40 in an upward position. The curved surface of element 40 minimizes the wear on the diaphragm 38 thereby significantly extending its working life.

Another improvement of our invention to the general punch apparatus is a means to detect broken punch elements. Sensor 60 with sensing element 62 is provided above each of the link elements 40. The position of the sensing element 62 is such to be able to detect when the punch element is forced upwardly into the punched head. If the punch element is broken, contact with an interposer mask fails to force the insert 40 against the sensor 60. In order to check the condition of the punch elements in the head, a solid plate is placed beneath the punch head, the punch head moved downwardly as in a punching cycle, and the indicating means for sensors 60 observed. No signal or indication will be received from a sensor associated with a broken punch element. The improvement can also be used in solenoid operated punch apparatus with only minor modifications.

Yet another improvement of our invention to the punch apparatus is a means to detect whether or not the diaphram 38 is ruptured. A passage 70 is in communication with air chamber 36. A suitable sensor 72, shown, in FIG. 2 is connected to passage 70. If the pressure in the air chamber 36 drops below a certain predetermined value, the sensor will detect the condition and produce a suitable signal indicating that the punch apparatus is malfunctioning.

The aforedescribed improvements to a punch apparatus, more particularly to a punch apparatus designed to punch very small via holes in green ceramic sheet will very significantly improve the performance and dependability of the punch apparatus. This will result in material improvements to the yield and produce lower production cost.

While the invention has been illustrated and described with reference to preferred embodiments thereof, it is to be understood that the invention is not limited to the precise construction herein disclosed and the right is reserved to all changes and modifications coming within the scope of the invention as defined in the appended claims.

We claim:

1. An improved interposer punch apparatus for punching small holes in sheet material having a plurality of elongated punch elements arranged in a matrix, a head slidably supporting the punch elements, means to urge the punch elements in an extended position, a spring biased stripper plate carried by the head with apertures for receiving the lower ends of the punch elements, and a base for supporting a substrate to be punched and having apertures for receiving the lower ends of the punch elements, the improvement comprising a means in said base to forcibly displace slugs of material punched from a substrate from the ends of said punch elements following a punching operation, said means including enlarged openings on the underside of said base associated with each of said apertures, a plurality of tubes positioned axially adjacent and below the associated said apertures in said base with the upper portions of said tubes located in said enlarged openings, and a means to force air through said tubes to thereby force said slugs of material from the punch ends, said tubes located in a common enclosure beneath said base with one of the ends of each tube open to the atmosphere, and a vacuum source connected to said enclosure to draw air through said tubes to thereby remove said slugs of material from said enclosure with a resultant generated current of air.

2. An improved interposer punch apparatus having a plurality of elongated punch elements, a head slidably supporting the punch elements, means to urge the punch elements in an extended position, a spring biased stripper plate carried by the head with apertures for receiving the lower ends of the punch elements, and a base for supporting a substrate to be punched and having apertures for receiving the lower ends of the punch elements, the improvement comprising a means in said base to forcible displace slugs of material punched from a substrate from the ends of said punch elements following a punching operation said means in said base including enlarged openings on the underside of said base associated with each of said apertures, a plurality of tubes positioned axially adjacent and below the associated said apertures in said base with the upper portions of said tubes located in said enlarged openings, and a means to force air through said tubes to thereby force said slugs of material from the punch ends, said tubes located in a common enclosure beneath said base with one of the ends of each tube open to the atmosphere, and a vacuum source connected to said enclosure to draw air through said tubes to thereby remove said slugs of material from said enclosure with a resultant generated current of air, said means to urge punch elements comprised of a plurality of elongated longitudinally slidable link inserts axially aligned with the respective said punch elements, each of said link inserts having a head and a stem portion, the head of said link inserts provided with a spherical surface with a radius of curvature significantly larger than the radius of said stem, said spherical surface of the head of each of said link elements terminating in a plane, a common chamber above said link inserts, said chamber having a substantially planar bottom wall, a diaphragm of resilient material overlying the upper ends of said link inserts and supported on said planar bottom wall of said chamber, the plane of said bottom wall and the plane of the termination of the spherical surfaces of said link elements substantially coinciding when said link inserts are positioned to extend said punch elements, a source of air pressure maintaining the pressure in said chamber above the atmospheric pressure thereby exerting a force against said link insert elements that urge said punch elements in extended position.

3. The punch apparatus of claim 2 which further includes a pressure sensor for sensing the pressure within said chamber, thereby providing an indication of the presence or absence of a leak in said diaphragm.

4. The punch apparatus of claim 2 which further includes a means for detecting whether or not individual punch elements are broken.

5. The punch apparatus of claim 4 wherein said means for detecting broken punch elements includes a plurality of sensors positioned over said plurality of link inserts, and adapted to sense whether or not said link insert elements move upwardly.

* * * * *